United States Patent
Kargl et al.

(10) Patent No.: US 10,326,434 B2
(45) Date of Patent: Jun. 18, 2019

(54) VOLTAGE COMPARATOR ARRANGEMENT, ELECTRONIC COMPONENT, CHIP CARD, EMBEDDED SECURE ELEMENT

(71) Applicant: Infineon Technologies AG, Neubiberg (DE)

(72) Inventors: Walter Kargl, Graz (AT); Albert Missoni, Graz (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/851,757

(22) Filed: Dec. 22, 2017

(65) Prior Publication Data
US 2018/0183421 A1    Jun. 28, 2018

(30) Foreign Application Priority Data
Dec. 27, 2016 (DE) .......................... 10 2016 125 717

(51) Int. Cl.
H03K 5/26 (2006.01)
G06K 19/07 (2006.01)
H03K 5/24 (2006.01)

(52) U.S. Cl.
CPC ........... *H03K 5/26* (2013.01); *G06K 19/0723* (2013.01); *H03K 5/24* (2013.01)

(58) Field of Classification Search
CPC ...................................................... H03K 5/26
See application file for complete search history.

(56) References Cited

U.S. PATENT DOCUMENTS

| | | | | |
|---|---|---|---|---|
| 5,991,888 A | * | 11/1999 | Faulkner | G01R 31/3016 702/120 |
| 6,654,898 B1 | | 11/2003 | Bailey et al. | |
| 7,501,868 B2 | * | 3/2009 | Ito | H02M 3/157 327/117 |
| 9,509,318 B2 | * | 11/2016 | Winemiller | G06F 1/12 |
| 2004/0095197 A1 | * | 5/2004 | Wang | H03L 7/095 331/100 |
| 2011/0304357 A1 | | 12/2011 | Tokairin | |
| 2012/0098688 A1 | * | 4/2012 | Kim | H03M 3/372 341/143 |
| 2012/0119786 A1 | * | 5/2012 | Shimizu | H03K 21/023 327/48 |

(Continued)

*Primary Examiner* — Thomas J. Hiltunen
(74) *Attorney, Agent, or Firm* — Viering, Jentschura & Partner MBB (57) ABSTRACT

In various embodiments, an electronic component is provided. The electronic component may include a supply bus configured to provide a supply voltage for an electronic circuit. The electronic component may further include a voltage-controlled oscillator, which is coupled to the supply bus and is configured to generate a clock signal with a clock frequency according to the supply voltage. The electronic component may further include at least one reference oscillator, which is configured to generate a reference clock signal with a reference clock frequency, and a comparator, which is coupled to the voltage-controlled oscillator and the at least one reference oscillator and is configured to compare the clock signal with the reference clock signal and, on the basis of the comparison, either to output the clock signal to the electronic circuit or to suppress it.

20 Claims, 7 Drawing Sheets

(56) References Cited

U.S. PATENT DOCUMENTS

| | | | |
|---|---|---|---|
| 2012/0275473 A1* | 11/2012 | Yamamoto | H04J 3/0688 370/496 |
| 2013/0243436 A1* | 9/2013 | Kargl | H04B 10/1143 398/115 |
| 2014/0118035 A1* | 5/2014 | Yamashida | G11C 7/20 327/143 |
| 2014/0232434 A1* | 8/2014 | Koazechi | G06F 1/08 327/40 |
| 2015/0287444 A1 | 10/2015 | Lee et al. | |
| 2016/0308516 A1* | 10/2016 | Narayan | G01R 19/1659 |
| 2017/0060165 A1* | 3/2017 | Kim | G05F 3/262 |

\* cited by examiner

FIG. 5B

VOLTAGE COMPARATOR ARRANGEMENT, ELECTRONIC COMPONENT, CHIP CARD, EMBEDDED SECURE ELEMENT

CROSS-REFERENCE TO RELATED APPLICATION

This application claims priority to German Patent Application Serial No. 10 2016 125 717.6, which was filed Dec. 27, 2016, and is incorporated herein by reference in its entirety.

TECHNICAL FIELD

Various embodiments relate generally to a voltage comparator arrangement, an electronic component, a chip card and an embedded secure element.

BACKGROUND

In general, electronic circuits, for example integrated circuits (ICs), which operate in a clock-based manner, are used for a large number of functions. The clock frequency with which the electronic circuit is operated can for example define its power consumption, a higher clock frequency usually being accompanied by a higher power consumption. Consequently, an adaptation of the clock frequency can be used for example to optimize the energy consumption of an electronic circuit. A reduction of the clock frequency can also be used to protect the electronic circuit from overheating, for example in the form of so-called heat management.

In systems with a limited energy supply, for example in battery-operated or passively operated electronic circuits (for example in passive wireless communication circuits), it may be helpful to adapt the dynamic power consumption to the resources available (for example the available electrical voltage or electrical power). For example, contactlessly communicating chip cards, in the case of which the operating energy is fed in wirelessly (for example in the case of credit cards), obtain varying amounts of electrical power for operating them, depending on how far away they are from the reader. It may be helpful in this respect to interrupt the clock-based operation of the electronic circuit when the supply voltage for the electrical circuit to be operated falls below a predefined supply voltage. In this way it is possible for example to avoid faulty operation of the electronic circuit. When a sufficient supply voltage or electrical power is available again, for example above the predefined supply voltage, the clock-based operation of the electronic circuit can be continued. The interruption of clock-based operation of an electronic circuit may be referred to for example as a clock stop. For example, a clock signal may be deliberately suppressed.

By means of a voltage-controlled oscillator, it is possible to generate on the basis of an input voltage a clock frequency assigned to the input voltage. This can for example make it possible when there is a falling supply voltage (as the input voltage of the voltage-controlled oscillator) of a circuit also at the same time to lower the clock frequency, and consequently the energy consumption. This alone however does not allow for the requirement that, as from a minimum supply voltage, a clock is no longer to be processed.

SUMMARY

In various embodiments, an electronic component is provided. The electronic component may include a supply bus configured to provide a supply voltage for an electronic circuit. The electronic component may further include a voltage-controlled oscillator, which is coupled to the supply bus and is configured to generate a clock signal with a clock frequency according to the supply voltage. The electronic component may further include at least one reference oscillator, which is configured to generate a reference clock signal with a reference clock frequency, and a comparator, which is coupled to the voltage-controlled oscillator and the at least one reference oscillator and is configured to compare the clock signal with the reference clock signal and, on the basis of the comparison, either to output the clock signal to the electronic circuit or to suppress it.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

In the following detailed description, reference is made to the accompanying drawings, which form part of this description and in which specific embodiments in which the invention can be carried out are shown for purposes of illustration. In this respect, directional terminology such as for instance "at the top", "at the bottom", "at the front", "at the rear", "front", "rear", etc. is used with reference to the orientation of the figure(s) described. Since components of embodiments may be positioned in a number of different orientations, the directional terminology serves for purposes of illustration and is in no way restrictive. It goes without saying that other embodiments may be used and structural or logical changes made without departing from the scope of protection of the present invention. It goes without saying that the features of the various embodiments described herein by way of example can be combined with one another, unless otherwise specifically stated. The following detailed description is therefore not to be interpreted in a restrictive sense, and the scope of protection of the present invention is defined by the appended claims.

In the course of this description, the terms "connected" and "coupled" are used for describing both a direct connection and an indirect connection and both a direct coupling and an indirect coupling. In the figures, identical or similar elements are provided with identical designations, wherever appropriate.

According to various embodiments, an electronic component in which a clock generator (for example a VCO or a VRO) is controlled (in an open-loop or closed-loop manner) in dependence on an internal voltage is provided. Consequently, a closed-loop control of the dynamic power consumption of a circuit can take place by changing the clock rate or clock frequency.

Conventionally, a very fast comparator is used, in order when the supply voltage falls below a threshold to suppress or deactivate the next system clock that is to be fed to the system. As a result, the dynamic power of the system is immediately brought to zero. The clock suppression remains active until the supply voltage has recovered again, i.e. until the comparator lifts the clock suppression again. In the case of such conventional arrangements, the accuracy and speed requirements for the comparator are very high, in order to stop the clock in time to prevent further operations that lead to a further lowering of the supply voltage and to prevent potential malfunctions, such as for example memory reading errors or the like. The requirement for the conventionally used analog circuitry increases as the system frequencies become higher.

According to various embodiments, the so-called "clock stop" information (i.e. the detection when the clock is to be suppressed or deactivated) is not intended to take place by way of a direct measurement of the analog supply voltage, but by a time measurement or frequency measurement. The time measurement or frequency measurement allows a digital (for example bit-wise or state-wise) determination of the "clock stop" information.

Figure 1:
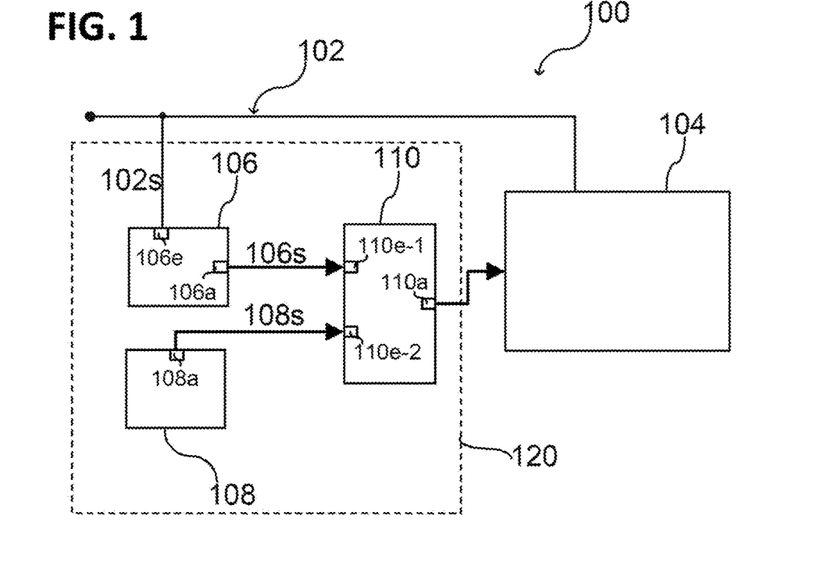
FIG. 1 shows an electronic component in a schematic representation, according to various embodiments.

FIG. 1 illustrates an electronic component 100 in a schematic view, according to various embodiments. The electronic component 100 may for example include a supply bus 102 (for example a voltage-carrying component, for example a voltage-carrying line or metallization). By means of the supply bus 102, a supply voltage 102s for an electronic circuit 104 can be provided. The electronic component 100 may for example be or include a chip or the like, it being possible for the electronic circuit 104 to be configured in a way corresponding to a desired manner of functioning. For example, the electronic circuit 104 may be any suitable circuit that operates in a clock-based manner. The electronic circuit 104 may for example include a flip-flop arrangement or the like. According to various embodiments, the electronic circuit 104 may include a wirelessly communicating chip, for example an NFC chip, for example a Bluetooth chip, or the like. According to various embodiments, the electronic circuit 104 may be a security-relevant circuit, for example an authentication circuit.

The electronic component 100 may furthermore include a voltage-controlled oscillator 106 (abbreviated as VCO). For example, a voltage-controlled ring oscillator (also known as a Vernier ring oscillator, abbreviated as VRO) may be used. The voltage-controlled oscillator 106 is for example coupled to the supply bus (for example connected in an electrically conducting manner). The voltage-controlled oscillator 106 is furthermore configured to generate a clock signal 106s with a clock frequency according to the supply voltage 102s. In this case, the clock frequency may be proportional to the supply voltage 102s, i.e. with an increasing supply voltage 102s, the clock frequency generated by means of the voltage-controlled oscillator 106 becomes greater. The clock signal 106s generated by means of the voltage-controlled oscillator 106 may be a square-wave signal between two voltage levels or a digital signal with two states (for example high and low, for example 1 and 0).

Furthermore, the electronic component 100 may include a reference oscillator 108. The reference oscillator 108 is for example configured to generate a reference clock signal 108s with a reference clock frequency. The reference clock signal 108s may be provided in a way similar to the clock signal 106s, for example as a square-wave signal between two voltage levels or as a digital signal with two states (for example high and low, for example 1 and 0), so that they can be compared with one another. In this case, the reference clock signal 108s is generated with a predefined reference clock frequency. By contrast with the clock frequency of the clock signal 106s, the reference clock frequency of the reference clock signal 108s is generated independently of the supply voltage 102s, so that it can be determined by means of the reference clock frequency whether the supply voltage 102s lies above a minimum voltage (in this case, the reference clock frequency is smaller than the clock frequency) or whether the supply voltage 102s lies below a minimum voltage (in this case, the reference clock frequency is greater than the clock frequency). The case where the clock frequency is equal to the reference clock frequency may for example be assigned to one of the two other cases ("smaller" or "greater").

Furthermore, the electronic component 100 may include a comparator 110 (for example a comparator arrangement or a comparator circuit). The comparator 110 is coupled both with the voltage-controlled oscillator 106 and with the reference oscillator 108. In this case, the comparator 110 is configured to compare the clock signal 106s with the reference clock signal 108s.

If for example the clock signal 106s is to be suppressed for supply voltages 102s that are too low, the comparator 110 may be configured only to output the clock signal 106s for the electronic circuit 104 if the clock frequency of the clock signal 106s is greater than the reference clock frequency of the reference clock signal 108s.

As an alternative to this, for example, the clock signal 106s may be limited to high clock frequencies if the comparator 110 is configured only to output the clock signal 106s for the electronic circuit 104 if the clock frequency of the clock signal 106s is smaller than (or smaller than or equal to) the reference clock frequency of the reference clock signal 108s.

The reference clock frequency of the reference clock signal 108s can clearly represent a minimum supply voltage of the electronic circuit 104, so that no clock signal for the electronic circuit 104 is output if the supply voltage 102s of the supply bus is smaller than the minimum supply voltage. Consequently, the power consumption of the electronic circuit 104 immediately falls to zero, since no clock is processed any longer. Consequently, the "clock stop" information conventionally determined in analog circuitry is clearly provided more precisely and at lower cost by means of digital circuitry.

According to various embodiments, a voltage comparator arrangement 120 can be used for influencing the clock generation for a chip operating in a clock-based manner. In this case, the voltage comparator arrangement 120 may include a voltage-controlled oscillator, which is coupled to a voltage-carrying component 102 and is configured to generate a digital time signal 106s according to an analog voltage signal 102s. Furthermore, the voltage comparator arrangement 120 may include a digital comparator 110, which is configured to compare the generated digital time signal 106s with a digital reference time signal 108s, the digital reference time signal 108s representing a comparison voltage for the analog voltage signal 102s. The digital comparator 110 may be configured to carry out the comparison in terms of "greater", "smaller" and/or "equal".

As illustrated for example in FIG. 1, the voltage-controlled oscillator 106 may include an input terminal 106e and an output terminal 106a, the input terminal 106e of the voltage-controlled oscillator 106 being connected to the supply bus 102. Furthermore, the voltage-controlled oscillator is configured to output the clock signal 106s at the output terminal 106a. Furthermore, the reference oscillator 108 may include an output terminal 108a and be configured to output the reference clock signal 108s at the output terminal 108a. The comparator 110 may include a first input terminal 110e-1, a second input terminal 110e-2 and an output terminal 110a. The first input terminal 110e-1 of the comparator 110 may be connected to the output terminal 106a of the voltage-controlled oscillator 106. The second input terminal 110e-2 of the comparator 110 may be connected to the output terminal 108a of the reference oscillator 108. The output terminal 110a of the comparator 110 may be coupled to the electronic circuit 104.

According to various embodiments, the reference oscillator 108 may be configured in such a way that the reference clock frequency of the reference clock signal 108s is generated independently of the supply voltage 102. For this purpose, the reference oscillator 108 may be a voltage-controlled oscillator, which is supplied with a predefined (for example constant over time) reference voltage, as illustrated in a schematic view for example in FIG. 2.

Figure 2:
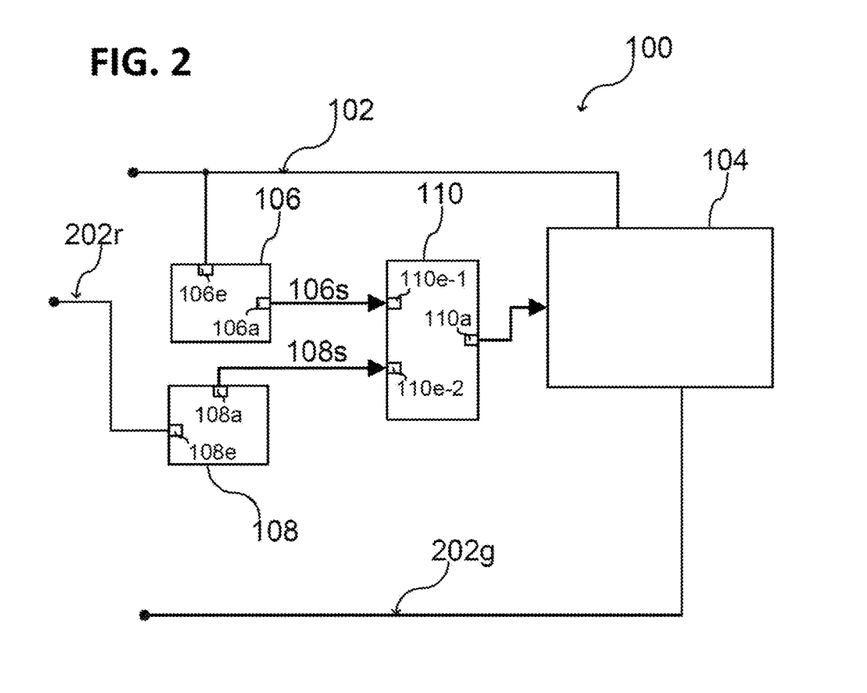
FIG. 2 shows an electronic component in a schematic representation, according to various embodiments.

According to various embodiments, the reference oscillator 108 may be coupled to a reference bus 202r; for example, an input terminal 108e of the reference oscillator 108 may be connected to the reference bus 202r. Consequently, the reference oscillator 108 can be operated with a reference voltage and the reference clock signal 108s can be generated with a corresponding reference clock frequency according to the reference voltage.

The electronic component 100 may operate with respect to a so-called ground bus 202g (for example connected to ground or to some other reference potential). It goes without saying that a reference potential defines the electrical voltages in the system.

Figure 3A:
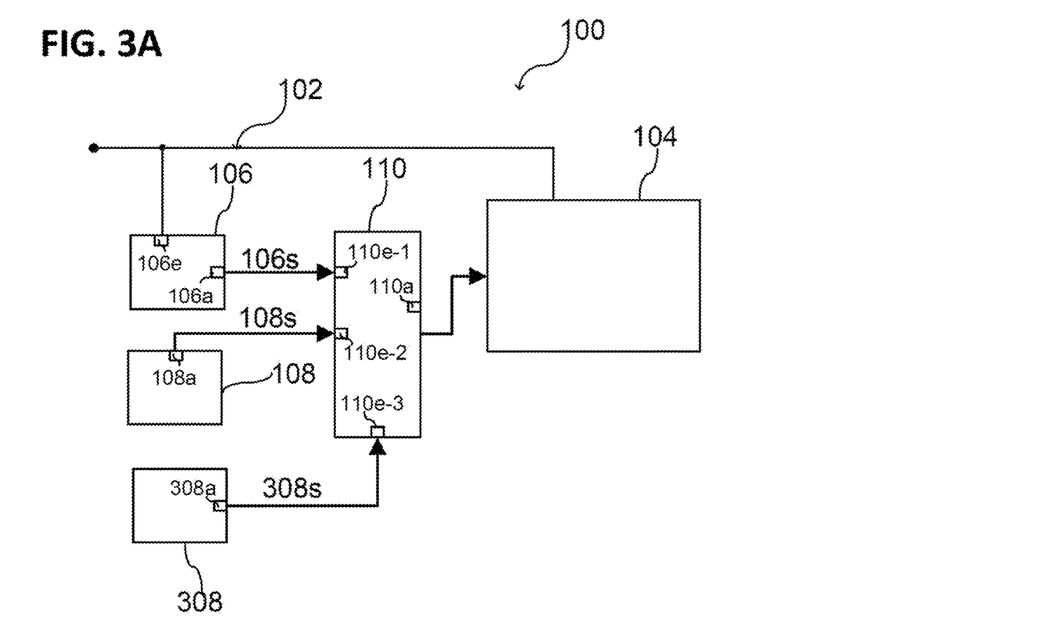
FIGS. 3A and 3B respectively show an electronic component in a schematic representation, according to various embodiments.
Figure 3B:
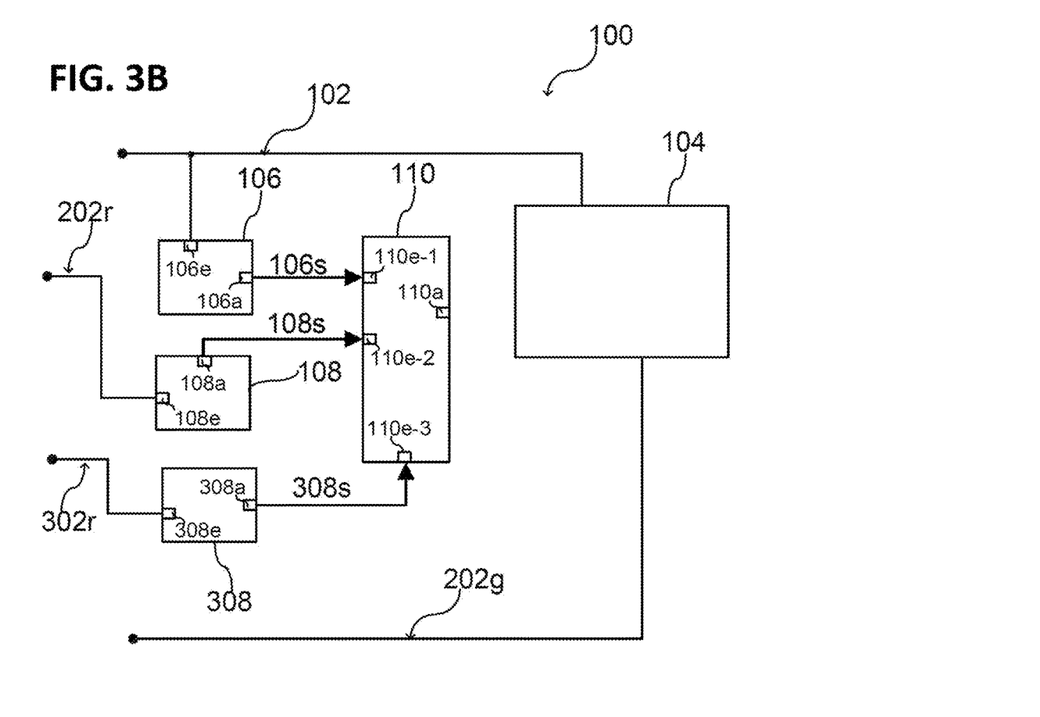

FIG. 3A and FIG. 3B respectively illustrate an electronic component 100 in a schematic view, according to various embodiments. The electronic component 100 may be configured as described above with respect to FIG. 1 and FIG. 2, but additionally include a further (i.e. second) reference oscillator 308.

The further reference oscillator 308 may for example be configured to generate a further (i.e. second) reference clock signal 308s with a further (i.e. second) reference clock frequency. The comparator 110 is correspondingly coupled to a further reference oscillator 308. Furthermore, the comparator 110 is configured to compare the clock signal 106s with the further reference clock signal 308s. The clock signal 106s for the electronic circuit 104 may for example be output whenever the clock frequency of the clock signal 106s is greater than the first reference clock frequency of the first reference clock signal 108s and also smaller than the second reference clock frequency of the second reference clock signal 308s. The two functions of the electronic component 100 described above, that is to say suppressing the clock when the frequency falls below a minimum frequency (i.e. a minimum voltage) and at the same time not exceeding the maximum clock frequency, are clear. The comparator is then configured as a so-called window comparator, which only outputs the clock signal 106s to the electronic circuit if the clock frequency of the clock signal lies between (i.e. in the region, clearly in the window) the two reference clock frequencies of the reference clock signals 108s, 308s.

According to various embodiments, the first reference clock frequency of the first reference clock signal 108s may be smaller than the second reference clock frequency of the second reference clock signal 308s, and consequently define a clock window for the clock frequency of the clock signal.

As illustrated in FIG. 3A and FIG. 3B, the comparator 110 may include a third input terminal 110e-e, which is connected to an output terminal 308a of the second reference oscillator 308. A predefined (for example constant over time) second reference voltage may be provided at an input terminal 308e of the second reference oscillator 308, for example by means of a second reference bus 302r. Alternatively, a voltage divider may also be used for example, in order to supply the two reference oscillators 108, 308 with different electrical voltages that are constant over time by means of only one reference bus 202r, 302r.

According to various embodiments, the electronic circuit 104 described herein may be a processor, for example a microprocessor, or be part of a processor, for example part of a microprocessor. According to various embodiments, the electronic component 100 may be a chip.

Figure 4A:
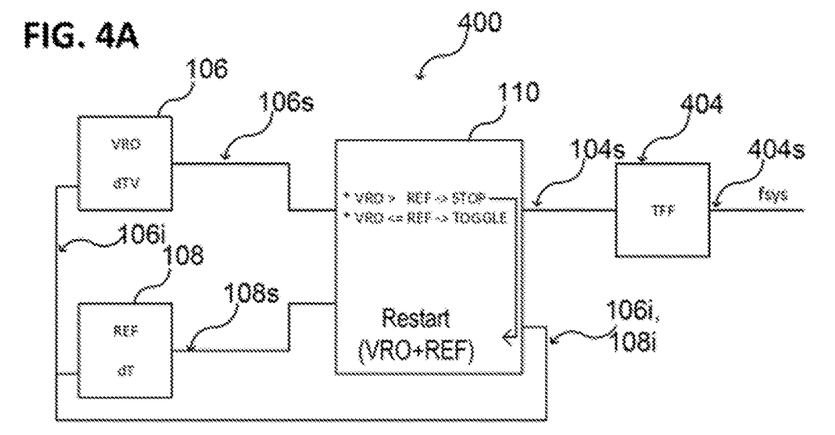
FIG. 4A shows an electronic component in a schematic representation, according to various embodiments.
Figure 4B:
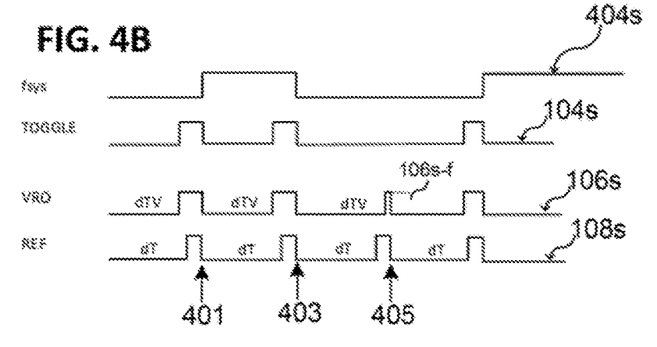
FIG. 4B shows a signal profile for the electronic component in a schematic representation, according to various embodiments.

FIG. 4A and FIG. 4B illustrate a functional principle for an electronic component 100, according to various embodiments.

In a system 400, in which a voltage-dependent clock source VRO (for example a VCO or a VRO) is used as the clock source, a time measurement (denoted by dT and dTV) may take place in such a way that a reference time measuring unit REF that is independent of the supply voltage (for example a VCO or a VRO with a fixed input voltage) is used. It goes without saying that a time measurement corresponds to a frequency measurement, which follows logically from the time measurement. For example, at the same time as the starting of the VRO chain, the reference system is started. If the reference unit REF is faster than the system clock, then according to one refinement the clock is suppressed, otherwise it is not. A VRO has for example the property that its period (and consequently the frequency generated) changes in dependence on the supply voltage. By means of the time measuring method, it is also possible to specify a maximum possible frequency at which a system clock is allowed (see for example FIG. 5A).

As illustrated in FIG. 4B, a runtime (i.e. time-measurement) based clock suppression circuit may be used, in order in this way to control the longest period (i.e. the smallest frequency) of the dynamic system. If the system becomes too slow, the time-based "clock stop" mechanism described herein prevents a malfunction from occurring at the electronic circuit (for example at an integrated circuit). The adaptation of the dynamic power consumption to the power available or the absolute voltage level is a consequent result.

The clock signal 104t output by the comparator 110 may for example be a toggle signal 104t for generating a system clock signal 404t with a system clock frequency. The system clock frequency may be generated by means of a toggle flip-flop circuit 404. In this case, the falling edge of the toggle signal may respectively generate the change in state in the system clock signal 404t, and consequently define the system clock frequency. The system clock frequency may for example be half the clock frequency of the toggle signal 104t.

The clock frequency of the clock signal 106s and the reference clock frequency of the reference clock signal 108s are obtained reciprocally from the time interval dT, dTV between two respectively neighboring falling edges or rising edges of the respective signal. Consequently, a time comparison can be carried out.

At a first point in time 401, for example after an initialization of the voltage-controlled oscillator 106, VRO, and of the reference oscillator 108, REF, the toggle signal 104t is output by the comparator 110 and the state of the system clock signal 404t, $f_{sys}$, is changed. If the clock frequency of the clock signal 106s of the voltage-controlled oscillator 106 is greater than the reference clock frequency of the reference clock signal 108s of the reference oscillator 108, the edge of the clock signal 106s in the case of the next-following clock falls earlier, at the point in time 403, than the edge of the reference clock signal 108s. In this case, the toggle signal 104t is in turn output by the comparator 110 and the state of the system clock signal 404t, $f_{sys}$, is changed. If the clock frequency of the clock signal 106s of the voltage-controlled oscillator 106 is smaller than the reference clock frequency of the reference clock signal 108s of the reference oscillator 108, the edge 106s-f of the clock signal 106s in the case of the next-following clock would fall later, at the point in time 405, than the edge of the reference clock signal 108s. In this case, the toggle signal 104t is not output by the comparator 110 and the state of the system clock signal 404t, $f_{sys}$, is not changed. Instead, the voltage-controlled oscillator 106 and the reference oscillator 108 are newly initialized (i.e. the comparison is newly initialized) at the point in time 405, beginning with a temporally synchronous falling edge of the clock signal 106s and of the reference clock signal 108s.

For newly initializing (in other words restarting) the time comparison or frequency comparison, an initializing signal 106i, 108i may be respectively sent by the comparator 110 to the voltage-controlled oscillator 106 and the reference oscillator 108.

According to various embodiments, the electronic component 100 described herein may be configured in such a way that the comparison of the clock signal with the reference signal is carried out in the case of every clock. For example, clock frequencies in each clock may be compared on the basis of the duration of the clock (also referred to as the period).

Figure 5A:
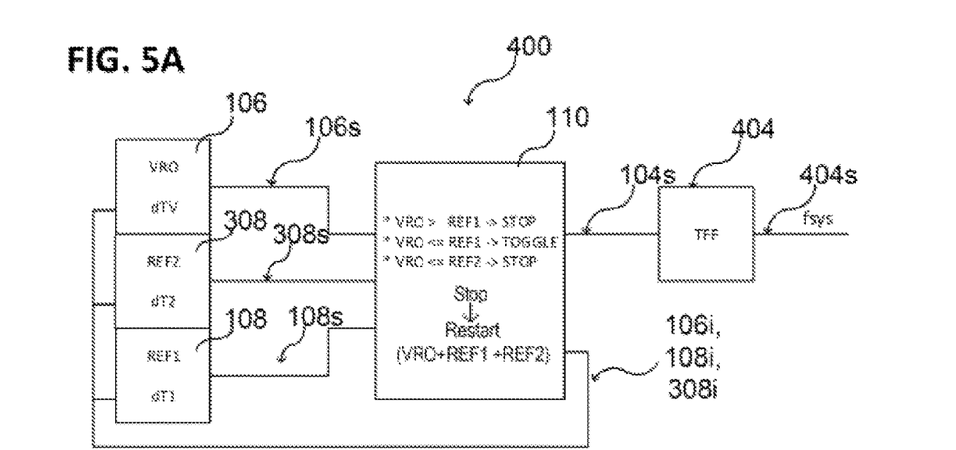
FIG. 5A shows an electronic component in a schematic representation, according to various embodiments.
Figure 5B:
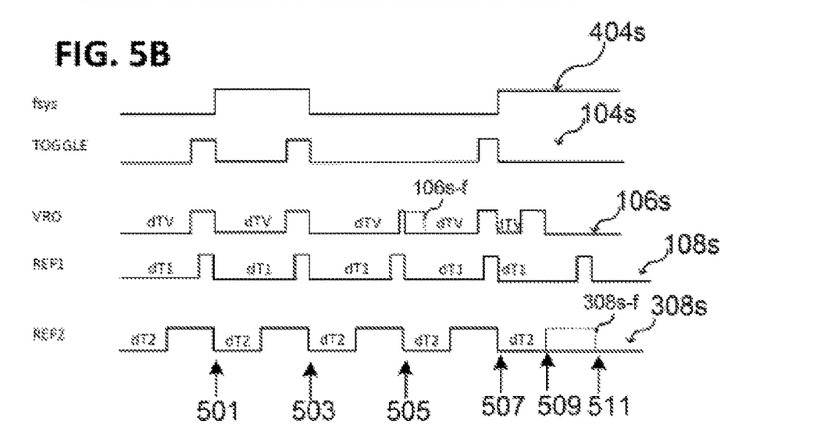
FIG. 5B shows a signal profile for the electronic component in a schematic representation, according to various embodiments.

FIG. 5A and FIG. 5B illustrate a functional principle for an electronic component 100, according to various embodiments.

According to various embodiments, a clock suppression circuit may be used, in order thereby to control the longest period (i.e. the lowest frequency) and the shortest period (i.e. the highest frequency) of the dynamic system. In both cases, if the system becomes too slow or too fast, the "clock stop" mechanism described herein prevents a malfunction from occurring at the electronic circuit. The closed-loop control of the dynamic power consumption on the basis of the power available is a consequent result. For limiting the greatest frequency, a second time base may be used. The system clock is in this case blocked until the reference chain has reached the reference time. The two reference oscillators 108, 308 may for example be provided by means of an inverted chain, two different taps being used in the inverted chain.

As illustrated in FIG. 5B, a runtime (i.e. time-measurement) based clock suppression circuit may be used, in order in this way to control the longest period (i.e. the smallest frequency) of the dynamic system and at the same time control the shortest period (i.e. the greatest frequency) of the dynamic system. If the clock frequency of the voltage-controlled oscillator 106 lies between the two reference frequencies, the toggle signal 104s is output by the comparator 110, otherwise it may be suppressed, for example if the clock frequency of the voltage-controlled oscillator 106 is smaller than the first reference frequency or greater than the second reference frequency. If the system becomes too slow, the time-based "clock stop" mechanism described herein prevents a malfunction from occurring at the electronic circuit (for example at an integrated circuit). If the system becomes too fast, the time-based "clock stop" mechanism described herein prevents a malfunction from occurring at the electronic circuit (for example at an integrated circuit). The closed-loop control of the dynamic power consumption on the basis of the power available or the electrical energy available is a consequent result.

As described above (cf. FIG. 4A and FIG. 4B), the clock signal 104t output by the comparator 110 may for example be a toggle signal 104t for generating a system clock signal 404t with a system clock frequency. The system clock frequency may be generated by means of a toggle flip-flop circuit 404. In this case, the falling edge of the toggle signal may respectively generate the change in state in the system clock signal 404t, and consequently define the system clock frequency. The system clock frequency may for example be half the clock frequency of the toggle signal 104t, and consequently for example also half the clock frequency of the clock signal 106s. The clock frequency of the clock signal 106s of the VRO and the reference clock frequencies of the reference clock signals 108s, 308s are obtained reciprocally from the time interval dT1, dT2, dTV between two respectively neighboring falling edges or rising edges of the respective signal. Consequently, a time comparison can be carried out.

At a first point in time 501, for example after an initialization of the voltage-controlled oscillator 106, VRO, of the first reference oscillator 108, REF1, and of the second reference oscillator 308, REF2, the toggle signal 104t is output by the comparator 110 and the state of the system clock signal 404t, $f_{sys}$, is changed. If the clock frequency of the clock signal 106s of the voltage-controlled oscillator 106 is greater than the reference clock frequency of the first reference clock signal 108s of the first reference oscillator 108, the edge of the clock signal 106s in the case of the next-following clock falls earlier, at the point in time 503, than the edge of the reference clock signal 108s. In this case, the toggle signal 104t is in turn output by the comparator 110 and the state of the system clock signal 404t, $f_{sys}$, is changed. If the clock frequency of the clock signal 106s of the voltage-controlled oscillator 106 is smaller than the reference clock frequency of the first reference clock signal 108s of the reference oscillator 108, the edge 106s-f of the clock signal 106s in the case of the next-following clock would fall later, at the point in time 505, than the edge of the first reference clock signal 108s. In this case, the toggle signal 104t is not output by the comparator 110 and the state of the system clock signal 404t, $f_{sys}$, is not changed. Instead, the voltage-controlled oscillator 106 and the reference oscillators 108, 308 are newly initialized (i.e. the comparison is newly initialized) at the point in time 505, beginning with a temporally synchronous falling edge of the clock signal 106s of the reference clock signals 108s, 308s.

For newly initializing (in other words restarting) the time comparison or frequency comparison, an initializing signal 106i, 108i, 308i may be respectively sent by the comparator 110 to the voltage-controlled oscillator 106 and the two reference oscillators 108, 308.

In the example represented, up until the point in time 507, the clock frequency of the clock signal 106s of the voltage-controlled oscillator 106 was smaller than the reference clock frequency of the second reference clock signal 308s of the second reference oscillator 308. Consequently, no clock suppression took place on the basis of the condition of the second reference oscillator 308. If the clock frequency of the clock signal 106s of the voltage-controlled oscillator 106 is greater than the reference clock frequency of the second reference clock signal 308s of the second reference oscillator 308, the edge of the clock signal 106s for example falls earlier, at the point in time 509, than the edge 308s-f of the second reference clock signal 308s. Consequently, the clock signal 106s is not output by the comparator as a toggle signal 104s and the system clock signal 404s does not change state. At the point in time 511, i.e. after the elapse of the clock of the second reference clock signal 308s, the comparison can be newly initialized again.

Figure 6:
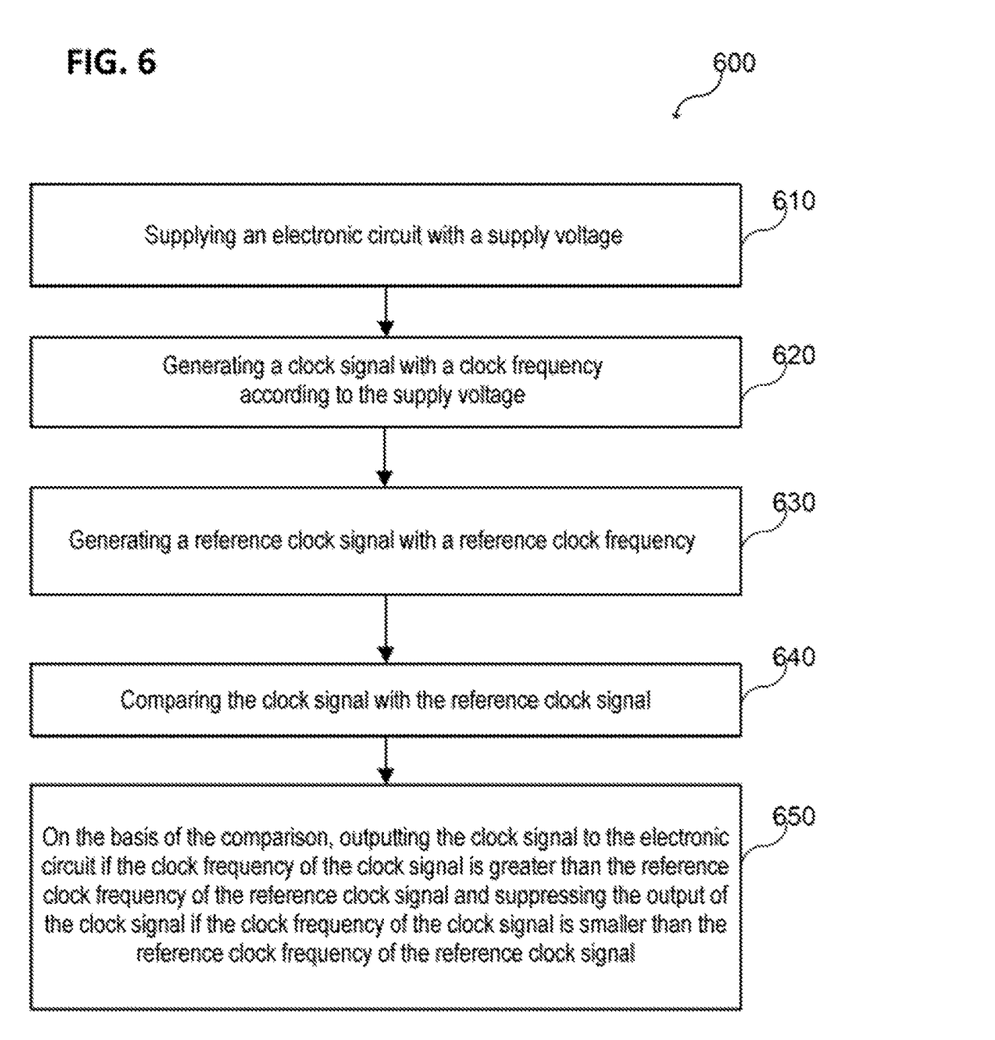
FIGS. 6 to 8 respectively show a schematic flow diagram for various methods, according to various embodiments.

FIG. 6 illustrates a schematic flow diagram of a method 600 (cf. for example FIG. 1 and FIG. 4A and FIG. 4B), according to various embodiments. The method 600 may for example include the following: in 610, supplying an electronic circuit 104 with a supply voltage 102s, in 620, generating a clock signal 106s with a clock frequency according to the supply voltage 102s, in 630, generating a reference clock signal 108s with a reference clock frequency (for example independently of the supply voltage), in 640, comparing the clock signal 106s with the reference clock signal 108s, and, in 650, on the basis of the comparison, outputting the clock signal 106s to the electronic circuit 104 if the clock frequency of the clock signal 106s is greater than (or greater than or equal to) the reference clock frequency of the reference clock signal 108s. In this case, the output of the clock signal 106s is suppressed at least whenever the clock frequency of the clock signal 106s is smaller than the reference clock frequency of the reference clock signal 108s.

Figure 7:
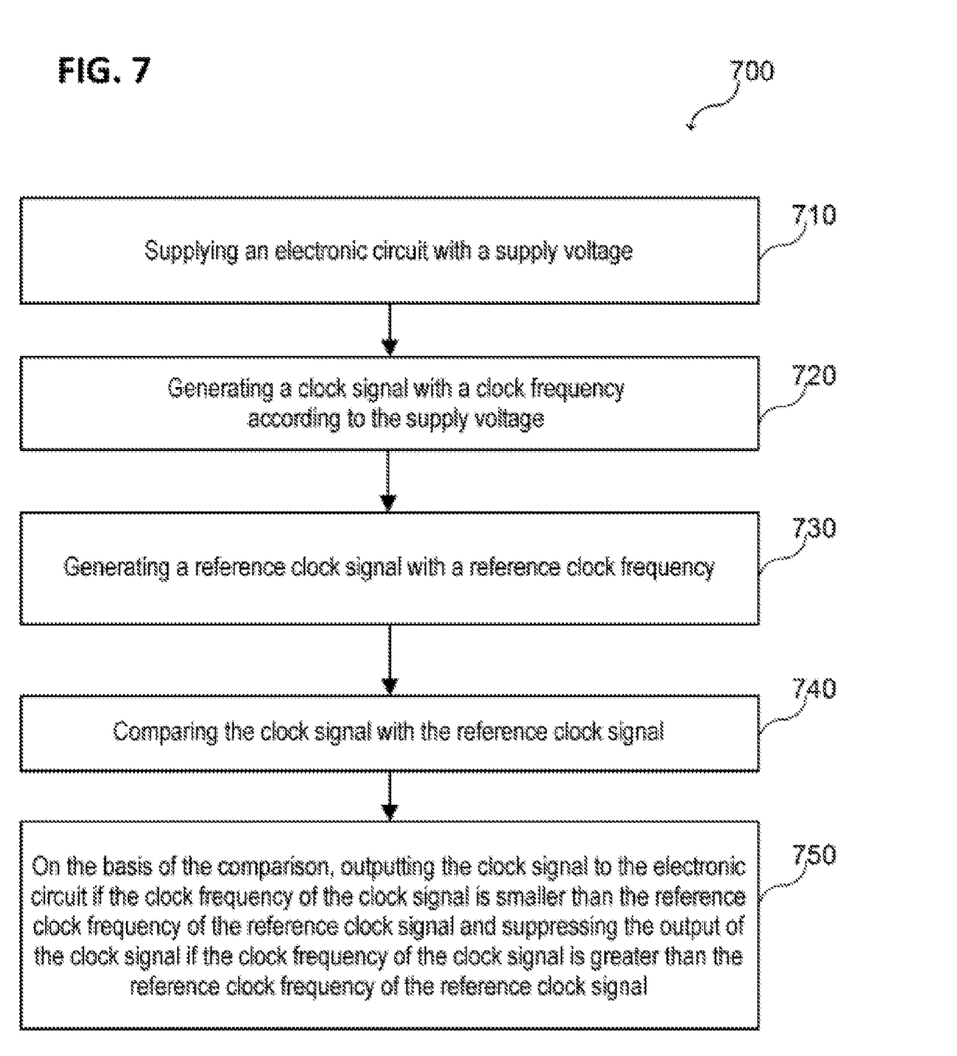

FIG. 7 illustrates a schematic flow diagram of a method 700 (cf. for example FIG. 3 and FIG. 5A and FIG. 5B), according to various embodiments. The method 700 may for example include the following: in 710, supplying an electronic circuit 104 with a supply voltage 102s, in 720, generating a clock signal 106s with a clock frequency according to the supply voltage 102s, in 730, generating a reference clock signal 308s with a reference clock frequency (for example independently of the supply voltage), in 740, comparing the clock signal 106s with the reference clock signal 308s, and, in 750, on the basis of the comparison, outputting the clock signal 106s to the electronic circuit 104 if the clock frequency of the clock signal 106s is smaller than (or smaller than or equal to) the reference clock frequency of the reference clock signal 308s. In this case, the output of the clock signal 106s is suppressed at least whenever the clock frequency of the clock signal 106s is greater than the reference clock frequency of the reference clock signal 308s.

Figure 8:
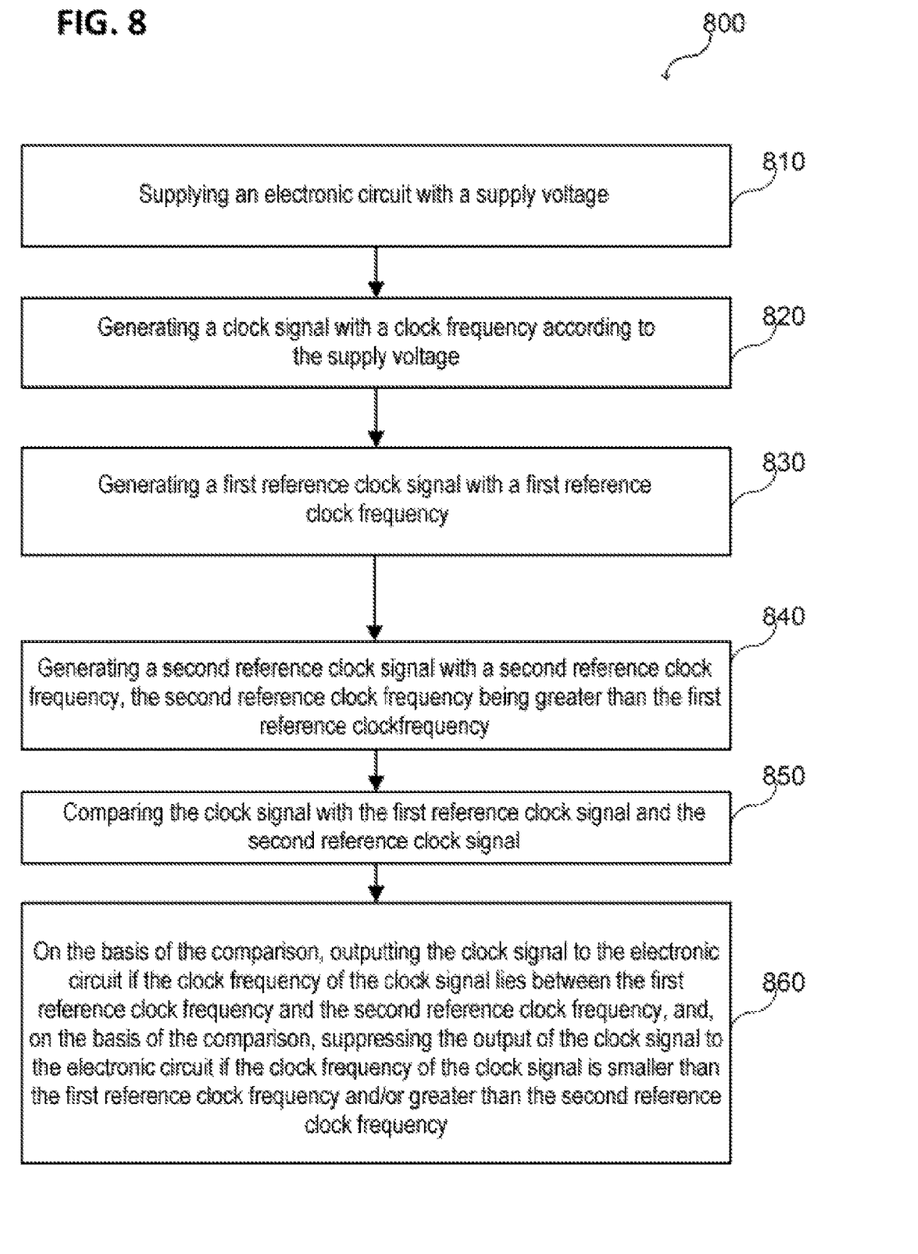

FIG. 8 illustrates a schematic flow diagram of a method 800 (cf. for example FIG. 3 and FIG. 5A and FIG. 5B), according to various embodiments. The method 800 may for example include the following: in 810, supplying an electronic circuit 104 with a supply voltage 102s, in 820, generating a clock signal 106s with a clock frequency according to the supply voltage 102s, in 830, generating a first reference clock signal 108s with a first reference clock frequency, in 840, generating a second reference clock signal 308s with a second reference clock frequency, the second reference clock frequency being greater than the first reference clock frequency, in 850, comparing the clock signal 106s with the first reference clock signal 108s and with the second reference clock signal 308s, and, in 860, on the basis of the comparison, outputting the clock signal 106s to the electronic circuit 104 if the clock frequency of the clock signal 106s is greater than (or greater than or equal to) the first reference clock frequency of the first reference clock signal 108s and smaller than (or smaller than or equal to) the second reference clock frequency of the second reference clock signal 308s. In this case, the output of the clock signal 106s is suppressed at least whenever the clock frequency of the clock signal 106s is smaller than the first reference clock frequency or whenever the clock frequency of the clock signal 106s is greater than the second reference clock frequency.

Various embodiments are based for example on the idea of increasing the accuracy and speed requirements for interrupting clock-based operation of an electronic circuit. For example, it has been recognized that a conventionally used analog measurement of the supply voltage on the basis of which an interruption of clock-based operation can take place may be too slow or too inaccurate for systems with high system clock frequencies (for example more than 50 MHz or more than 100 MHz).

Various embodiments are for example also based on the recognition that it may be helpful also to specify a maximum clock frequency along with a minimum supply voltage (i.e. also an assigned minimum clock frequency) for operating an electronic circuit.

According to various embodiments, a clock interruption in the operation of an electronic circuit takes place on the basis of a time comparison. A time comparison makes possible for example a faster and more precise open-loop/closed-loop control of the clock interruption than a conventionally used analog voltage measurement. The time comparison may for example take place by means of a reference time signal, with which a voltage-dependent time signal is compared. The time comparison may for example take place by means of a reference clock signal, which is compared with a voltage-dependent clock signal. The voltage-dependent clock signal clearly represents an electrical voltage and can consequently be used to interrupt the clock-based operation of an electronic circuit on the basis of a time comparison.

The reference clock signal can in this case clearly represent a reference voltage (for example a minimum supply voltage). It goes without saying that a frequency, f, is assigned a period (i.e. a time), T. In the case of an electronic circuit that has a clock frequency, f, (also referred to as a rate or clock rate) of 1 GHz, the period, 1/f, is correspondingly 1 ns. A clock signal (also known as a system clock) in digital technology is a signal, for example a binary signal, that is used for the coordination and/or synchronization of an electronic circuit (for example a multiplicity of flip-flops can be activated in a clock-based manner, etc.). The clock signal may for example be provided periodically with a frequency (referred to as the clock frequency). The clock signal oscillates for example with the clock frequency between two logic levels (without restricting generality 0 and 1). In the case of a digital signal, with for example two logic levels, a duty factor is also defined, i.e. the temporally symmetrical or asymmetrical division of the period between the durations of the respective logic levels. In the case of a duty factor of 0.5, for example, each logic level has the same time duration within the period. The clock signal may for example be a square-wave signal.

According to various embodiments, a comparator is used for comparing two clock signals. The comparator may be a digital electronic circuit or part of a digital electronic circuit which can compare two digital or discrete values with one another. By means of a so-called identity comparator, for example, two bits (or logic states of the clock signal) can be checked for being identical. Furthermore, a so-called magnitude comparator may be used, in order to compare two clock signals (for example bit-wise or two logic states of the respective clock signal) additionally also with respect to the relations "greater" and "smaller". It can consequently be determined for example by means of a comparator which of two clock signals has the greater frequency and which has the smaller frequency, in that for example the periods or the time durations of the logic states are compared with one another. A comparison of periods or time durations clearly also corresponds to a comparison of frequencies. Conversely, a comparison of frequencies also corresponds to a comparison of periods or time durations.

According to various embodiments, an electronic component may include the following: a supply bus for providing a supply voltage for an electronic circuit, a voltage-controlled oscillator, which is coupled to the supply bus, and is configured to generate a clock signal with a clock frequency according to the supply voltage, a reference oscillator, which is configured to generate a reference clock signal with a reference clock frequency, a comparator, which is coupled to the voltage-controlled oscillator and the reference oscillator, and is configured to compare the clock signal with the reference clock signal and only to output the clock signal for the electronic circuit if the clock frequency of the clock signal is greater than the reference clock frequency of the reference clock signal or equal to the reference clock frequency of the reference clock signal.

According to various embodiments, the reference oscillator may be configured in such a way that the reference clock frequency of the reference clock signal is independent of the supply voltage.

According to various embodiments, the reference clock frequency of the reference clock signal may define a minimum supply voltage of the electronic circuit, so that no clock signal for the electronic circuit is output if the supply voltage of the supply bus is smaller than the minimum supply voltage.

According to various embodiments, the clock signal may be a toggle signal for generating a system clock signal with a system clock frequency. The toggle signal causes a change in state in the system clock signal, for example by means of a clock-controlled (for example clock-edge-controlled) flip-flop (for example a so-called toggle flip-flop or the like).

According to various embodiments, the comparator may be configured in such a way that the comparison is newly initialized if the output of the clock signal has been prevented. For example, the reference oscillator and the voltage-controlled oscillator may be started synchronously.

According to various embodiments, the electronic component may also include the following: a further reference oscillator, which is configured to generate a further reference clock signal with a further reference clock frequency, the comparator also being coupled to the further reference oscillator, and configured to compare the clock signal with the further reference clock signal and only to output the clock signal for the electronic circuit if the clock frequency of the clock signal is smaller than the further reference clock frequency of the further reference clock signal or equal to the further reference clock frequency. The comparator in this case clearly operates as a so-called window comparator between the two reference clock frequencies.

According to various embodiments, the reference clock frequency (also referred to herein as the first reference clock frequency) may be smaller than the further reference clock frequency (also referred to herein as the second reference clock frequency).

According to various embodiments, the comparator may be configured in such a way that the comparison is newly initialized after the clock of the further reference clock signal with which the output of the clock signal was prevented has ended. For example, the reference oscillator, the further reference oscillator and the voltage-controlled oscillator may be started synchronously.

According to various embodiments, an electronic component may include the following: a supply bus for providing a supply voltage for an electronic circuit, a voltage-controlled oscillator, which is coupled to the supply bus, and is configured to generate a clock signal with a clock frequency according to the supply voltage, a reference oscillator, which is configured to generate a reference clock signal with a reference clock frequency, a comparator, which is coupled to the voltage-controlled oscillator and the reference oscillator, and is configured to compare the clock signal with the reference clock signal. The comparator may be configured only to output the clock signal for the electronic circuit if the clock frequency of the clock signal is smaller than (or smaller than or equal to) the reference clock frequency of the reference clock signal. The comparator may alternatively be configured only to output the clock signal for the electronic circuit if the clock frequency of the clock signal is greater than (or greater than or equal to) the reference clock frequency of the reference clock signal.

According to various embodiments, an electronic component may include the following: a supply bus for providing a supply voltage for an electronic circuit, a voltage-controlled oscillator with an input terminal and an output terminal, the input terminal of the voltage-controlled oscillator being connected to the supply bus, and the voltage-controlled oscillator being configured to generate and to output at the output terminal of the voltage-controlled oscillator a clock signal with a clock frequency according to the supply voltage present at the input terminal, a reference oscillator with an output terminal, the reference oscillator being configured to output a reference clock signal with a reference clock frequency at the output terminal of the reference oscillator, a comparator circuit with a first input terminal, a second input terminal and an output terminal, the first input terminal of the comparator circuit being connected to the output terminal of the voltage-controlled oscillator, the second input terminal of the comparator circuit being connected to the output terminal of the reference oscillator, the output terminal of the comparator circuit being coupled to the electronic circuit, and the comparator circuit being configured to compare the clock signal with the reference clock signal. The comparator circuit may be configured to output a system clock signal at the output terminal of the comparator circuit if the clock frequency of the clock signal is greater than (or greater than or equal to) the reference clock frequency of the reference clock signal. The comparator circuit may be configured to output a system clock signal at the output terminal of the comparator circuit if the clock frequency of the clock signal is smaller than (or smaller than or equal to) the reference clock frequency of the reference clock signal.

According to various embodiments, an electronic component may include the following: a supply bus for providing a supply voltage for an electronic circuit, a voltage-controlled oscillator with an input terminal and an output terminal, the input terminal of the voltage-controlled oscillator being connected to the supply bus, and the voltage-controlled oscillator being configured to generate and output at the output terminal of the voltage-controlled oscillator a clock signal with a clock frequency according to the supply voltage present at the input terminal, a first reference oscillator with an output terminal, the first reference oscillator being configured to output a first reference clock signal with a first reference clock frequency at the output terminal of the first reference oscillator, a second reference oscillator with an output terminal, the second reference oscillator being configured to output a second reference clock signal with a second reference clock frequency at the output terminal of the second reference oscillator, the first reference clock frequency being smaller than the second reference clock frequency, a window comparator circuit with a first input terminal, a second input terminal, a third input terminal and an output terminal, the first input terminal of the window comparator circuit being connected to the output terminal of the voltage-controlled oscillator, the second input terminal of the window comparator circuit being connected to the output terminal of the first reference oscillator, the third input terminal of the window comparator circuit being connected to the output terminal of the second reference oscillator, the output terminal of the window comparator circuit being coupled to the electronic circuit, and the window comparator circuit being configured to compare the clock signal with the reference clock signal and only to output a system clock signal at the output terminal of the window comparator circuit if the clock frequency of the clock signal is greater than (or greater than or equal to) the first reference clock frequency of the first reference clock signal and smaller than (or smaller than or equal to) the second reference clock frequency of the second reference clock signal.

According to various embodiments, a chip card (for example a chip card with a wireless interface) may include the electronic component described herein, according to various embodiments.

According to various embodiments, an embedded secure element (for example an embedded secure element with a wireless interface) may include the electronic component described herein, according to various embodiments. The clock stop method described herein, which is based on a time comparison or frequency comparison, can clearly be used for the operation of a security-relevant circuit, for example for a security circuit integrated in a wireless communication chip, for example a security circuit integrated in an NFC (Near Field Communication) chip.

According to various embodiments, a method for generating a system clock of an electronic component may include the following: supplying an electronic circuit with a supply voltage, generating a clock signal with a clock frequency according to the supply voltage, generating a reference clock signal with a reference clock frequency independently of the supply voltage, comparing the clock signal with the reference clock signal, and, on the basis of the comparison, only outputting the clock signal to the electronic circuit whenever the clock frequency of the clock signal is greater than (or greater than or equal to) the reference clock frequency of the reference clock signal.

According to various embodiments, a method for generating a system clock of an electronic component may include the following: supplying an electronic circuit with a supply voltage, generating a clock signal with a clock frequency according to the supply voltage, generating a first reference clock signal with a first reference clock frequency independently of the supply voltage, generating a second reference clock signal with a second reference clock frequency independently of the supply voltage, comparing the clock signal with the first reference clock signal or the second reference clock signal, and, on the basis of the comparison, only outputting the clock signal to the electronic circuit whenever the clock frequency of the clock signal is greater than (or greater than or equal to) the first reference clock frequency of the first reference clock signal and smaller than (or smaller than or equal to) the second reference clock frequency of the second reference clock signal.

According to various embodiments, a method for generating a system clock of an electronic component may include the following: supplying an electronic circuit with a supply voltage, generating a clock signal with a clock frequency according to the supply voltage, generating a reference clock signal with a reference clock frequency independently of the supply voltage, comparing the clock signal with the reference clock signal, and, on the basis of the comparison, only outputting the clock signal to the electronic circuit whenever the clock frequency of the clock signal is smaller than (or smaller than or equal to) the reference clock frequency of the reference clock signal.

According to various embodiments, a voltage comparator arrangement may include the following: a voltage-controlled oscillator, which is configured to generate a digital time signal on the basis of an analog voltage signal, and a digital comparator, which is configured to compare the generated digital time signal with a digital reference time signal, the digital reference time signal representing a comparison voltage for the analog voltage signal. The digital comparator may be configured to carry out the comparison in terms of "greater", "smaller" and/or "equal".

According to various embodiments, a voltage comparator arrangement may include the following: a voltage-carrying component, to which an analog voltage signal to be compared is applied, a voltage-controlled oscillator, which is coupled to the voltage-carrying component and is configured to generate a digital time signal according to the analog voltage signal, and a digital comparator, which is configured to compare the generated digital time signal with a digital reference time signal, the digital reference time signal representing a comparison voltage for the analog voltage signal. The digital comparator may be configured to carry out the comparison in terms of "greater", "smaller" and/or "equal".

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An electronic component, comprising:
   a supply bus configured to provide a supply voltage for an electronic circuit;
   a voltage-controlled oscillator, which is coupled to the supply bus and is configured to generate a clock signal with a clock frequency according to the supply voltage;
   at least one reference oscillator, which is configured to generate a reference clock signal with a reference clock frequency; and
   a comparator, which is coupled to the voltage-controlled oscillator and the at least one reference oscillator and is configured to compare the clock signal with the reference clock signal and, based on the comparison, either to output the clock signal to the electronic circuit or to suppress it,
wherein the comparator is configured to output the clock signal if the clock frequency of the clock signal is greater than the reference clock frequency of the reference clock signal, and to suppress the clock signal if the clock frequency of the clock signal is smaller than the reference clock frequency of the reference clock signal, and
wherein the reference clock frequency of the reference clock signal represents a minimum supply voltage of the electronic circuit, so that the clock signal is not output by the voltage-controlled oscillator to the electronic circuit if the supply voltage of the supply bus is smaller than the minimum supply voltage.

2. The electronic component of claim 1,
wherein the at least one reference oscillator is configured in such a way that the reference clock frequency of the reference clock signal is at least one of independent of the supply voltage or constant over time.

3. The electronic component of claim 1,
wherein the clock signal is a toggle signal for generating a system clock signal with a system clock frequency.

4. The electronic component of claim 1,
wherein the comparator is configured in such a way that the comparison is newly initialized if the output of the clock signal has been suppressed.

5. A chip card, comprising:
the electronic component of claim 1.

6. An embedded secure element, comprising:
the electronic component of claim 1.

7. A method, comprising:
supplying an electronic circuit with a supply voltage;
generating a clock signal with a clock frequency according to the supply voltage;
generating a reference clock signal with a reference clock frequency;
comparing the clock signal with the reference clock signal; and
based on the comparison, outputting the clock signal to the electronic circuit or suppressing the output of the clock signal,
wherein the clock signal is output if the clock frequency of the clock signal is smaller than the reference clock frequency of the reference clock signal, and
wherein the output of the clock signal is suppressed if the clock frequency of the clock signal is greater than the reference clock frequency of the reference clock signal.

8. A method, comprising
supplying an electronic circuit with a supply voltage;
generating a clock signal with a clock frequency according to the supply voltage;
generating a first reference clock signal with a first reference clock frequency;
generating a second reference clock signal with a second reference clock frequency;
comparing the clock signal with the first reference clock signal and the second reference clock signal;
based on the comparison, outputting the clock signal to the electronic circuit if the clock frequency of the clock signal lies between the first reference clock frequency and the second reference clock frequency, and
based on the comparison, suppressing the output of the clock signal to the electronic circuit if the clock frequency of the clock signal is smaller than the first reference clock frequency or if the clock frequency of the clock signal is greater than the second reference clock frequency.

9. An electronic component, comprising:
a supply bus configured to provide a supply voltage for an electronic circuit;
a voltage-controlled oscillator, which is coupled to the supply bus and is configured to generate a clock signal with a clock frequency according to the supply voltage;
at least one reference oscillator, which is configured to generate a reference clock signal with a reference clock frequency; and
a comparator, which is coupled to the voltage-controlled oscillator and the at least one reference oscillator and is configured to compare the clock signal with the reference clock signal and, based on the comparison, either to output the clock signal to the electronic circuit or to suppress it,
wherein the comparator is configured to output the clock signal if the clock frequency of the clock signal is smaller than the reference clock frequency of the reference clock signal, and to suppress the clock signal if the clock frequency of the clock signal is greater than the reference clock frequency of the reference clock signal.

10. The electronic component of claim 9,
wherein the reference clock frequency of the reference clock signal represents a maximum clock frequency, so that the clock signal is not output by the voltage controlled oscillator to the electronic circuit if the clock frequency of the clock signal is greater than the maximum clock frequency.

11. A chip card, comprising:
the electronic component of claim 9.

12. The chip card of claim 11,
wherein the reference clock frequency of the reference clock signal represents a maximum clock frequency, so that the clock signal is not output by the voltage controlled oscillator to the electronic circuit if the clock frequency of the clock signal is greater than the maximum clock frequency.

13. An embedded secure element, comprising;
the electronic component of claim 9.

14. The embedded secure element of claim 13,
wherein the reference clock frequency of the reference clock signal represents a maximum clock frequency, so that the clock signal is not output by the voltage controlled oscillator to the electronic circuit if the clock frequency of the clock signal is greater than the maximum clock frequency.

15. An electronic component, comprising:
a supply bus configured to provide a supply voltage for an electronic circuit;
a voltage-controlled oscillator, which is coupled to the supply bus and is configured to generate a clock signal with a clock frequency according to the supply voltage;
at least one reference oscillator, which is configured to generate a reference clock signal with a reference clock frequency; and
a comparator, which is coupled to the voltage-controlled oscillator and the at least one reference oscillator and is configured to compare the clock signal with the reference clock signal and, based on the comparison, either to output the clock signal to the electronic circuit or to suppress it,
wherein the at least one reference oscillator comprises a first reference oscillator and a second reference oscillator; wherein the first reference oscillator is configured to generate a first reference clock signal with a first reference clock frequency, and wherein the second reference oscillator is configured to generate a second reference clock signal with a second reference clock frequency, the second reference clock frequency being greater than the first reference clock frequency; and wherein the comparator is coupled to the first and second reference oscillators and is configured to compare the clock signal with the first and second reference clock signals and to output the clock signal to the electronic circuit if the clock frequency of the clock signal is greater than the first reference clock frequency and smaller than the second reference clock frequency and to suppress the output of the clock signal to the electronic circuit if the clock frequency of the clock signal is smaller than the first reference clock frequency or greater than the second reference clock frequency.

16. The electronic component of claim 15, wherein the at least one reference oscillator is configured in such a way that the reference clock frequency of the reference clock signal is at least one of independent of the supply voltage or constant over time.

17. The electronic component of claim 15, wherein the clock signal is a toggle signal for generating a system clock signal with a system clock frequency.

18. The electronic component of claim 15, wherein the comparator is configured in such a way that the comparison is newly initialized if the output of the clock signal has been suppressed.

19. A chip card, comprising:
the electronic component of claim 15.

20. An embedded secure element, comprising;
the electronic component of claim 15.

* * * * *